United States Patent [19]

Burgess et al.

[11] Patent Number: 4,649,417

[45] Date of Patent: Mar. 10, 1987

[54] MULTIPLE VOLTAGE INTEGRATED CIRCUIT PACKAGING SUBSTRATE

[75] Inventors: Allan C. Burgess, Yorktown Heights; Robert O. Lussow, Hopewell Junction; George E. Melvin, Poughkeepsie, all of N.Y.

[73] Assignee: International Business Machines Corporation, Armonk, N.Y.

[21] Appl. No.: 534,900

[22] Filed: Sep. 22, 1983

[51] Int. Cl.[4] .......................................... H01L 39/02
[52] U.S. Cl. ...................................... 357/80; 357/74; 323/353
[58] Field of Search ...................... 357/51, 74, 75, 80; 323/353, 354; 361/407

[56] References Cited

U.S. PATENT DOCUMENTS

| | | | |
|---|---|---|---|
| 2,717,942 | 9/1955 | Andrews | 323/353 |
| 3,656,028 | 4/1972 | Langdon | 357/51 |
| 3,968,193 | 7/1976 | Langston, Jr. et al. | 357/80 |
| 4,181,878 | 1/1980 | Murari et al. | 357/51 |
| 4,231,154 | 11/1980 | Gazdik et al. | 357/72 |
| 4,255,672 | 3/1981 | Ohno et al. | 357/51 |
| 4,407,007 | 9/1983 | Desai et al. | 357/74 |
| 4,453,176 | 6/1984 | Chance et al. | 357/68 |
| 4,514,749 | 4/1985 | Shoji | 357/80 |
| 4,527,180 | 7/1985 | Oto | 357/51 |
| 4,551,746 | 11/1985 | Gilbert et al. | 357/74 |
| 4,551,747 | 11/1985 | Gilbert et al. | 357/74 |

FOREIGN PATENT DOCUMENTS

| | | |
|---|---|---|
| 0072644 | 2/1983 | European Pat. Off. . |
| 0083405 | 7/1983 | European Pat. Off. . |
| 2753236 | 5/1979 | Fed. Rep. of Germany . |

OTHER PUBLICATIONS

Blodgett, Jr., Scientific American, Jul. 1983, vol. 249, No. 1, "Microelectronic Packaging", pp. 86–96.
IBM Journal of Research & Development, vol. 26, No. 3, May 1982, pp. 286–296. Armonk, New York, US; C. W. Ho et al.: "The Thin-Film Module as a High-Performance Semiconductor Package.

Primary Examiner—William L. Sikes
Assistant Examiner—Frank González
Attorney, Agent, or Firm—Mitchell S. Bigel; Steven J. Meyers

[57] ABSTRACT

A multilayer ceramic integrated circuit packaging substrate provides a plurality of integrated circuit operating voltages at the integrated circuit mounting surface thereof without requiring a separate input/output pin and internal power distribution plane for every integrated circuit operating voltage. The substrate includes a power via for supplying a first integrated circuit operating voltage at the integrated circuit mounting surface, and a plurality of voltage converting means on the integrated circuit mounting surface for stepping down the first operating voltage to all other requisite operating voltages. The voltage converting means may be resistors or operational amplifier voltage dividers.

13 Claims, 2 Drawing Figures

MULTIPLE VOLTAGE INTEGRATED CIRCUIT PACKAGING SUBSTRATE

BACKGROUND OF THE INVENTION

1. Technical Field

This invention relates to multilayer dielectric material integrated circuit packaging substrates, and more particularly to such a substrate which is adapted to provide multiple integrated circuit operating voltages at the integrated circuit mounting surface thereof.

2. Background Art

The use of multilayer dielectric (e.g., ceramic) substrates for mounting and interconnecting integrated circuit devices is well known in the art. Multilayer ceramic substrates are fabricated of multiple layers of green ceramic sheets which are metallized stacked, laminated and fired to form a monolithic ceramic package. Once fired, the multilayer ceramic substrate provides a three dimensional packaging structure which includes wiring in what was formerly waste or inaccessable space within the substrate.

The internal structure of the multilayer ceramic substrate includes a plurality of signal planes, each having a predetermined metallization pattern. Vias electrically connect predetermined signal planes to one another, to the integrated circuit mounting surface (hereinafter referred to as top surface) and to the input/output pin surface (hereinafter referred to as bottom surface) of the substrate. Also included are a plurality of power distribution planes and associated vias, for electrically connecting integrated circuit operating voltages supplied at predetermined input/output pins on the bottom surface, to appropriate integrated circuit mounting positions on the top surface.

In the present state of the art, it is common to employ large scale integrated circuit chips which require a plurality of operating voltages. Moreover, it is also common to employ integrated circuits from different manufacturers which may likewise require different operating voltages. The requirement for multiple operating voltages complicates the multilayer ceramic substrate, with a consequent yield and reliability impact, as described more particularly below.

Operating voltage distribution in the multilayer ceramic substrate is typically accomplished by providing a power distribution plane for each operating voltage. One or more vias electrically connect the power distribution plane to an appropriate input/output pin at the bottom surface. An appropriate operating voltage is supplied to each input/output pin from a motherboard or card, or by directly connecting an appropriate power supply to the pin. Vias also electrically connect each power distribution plane to appropriate integrated circuit mounting positions at the top surface, so that the required operating voltages are provided to each integrated circuit chip. Thus, each distinct operating voltage requires an input/output pin and a power distribution plane.

In the state of the art circuit packaging environment described above, up to five or more different operating voltages may be required. Accordingly, up to five or more pins and power distribution planes may be required. Unfortunately as the circuit packaging density increases, it becomes difficult to provide the requisite number of input/output pins. Moreover, each power distribution plane requires a separate internal layer in the multilayer ceramic substrate. It is well known that an increase in the number of internal layers dramatically increases cost and adversely impacts manufacturing yield and reliability. Finally, the requirement of multiple voltages at the input/output pins complicates the motherboard or card and complicates the power supply which supplies the multiple voltages. Accordingly, the requirement for an input/output pin and a power distribution plane for each operating voltage limits the ability to employ multiple voltage integrated circuits or integrated circuits from different manufacturers in multilayer ceramic packaging technology.

DISCLOSURE OF THE INVENTION

It is therefore an object of the invention to provide an improved multilayer ceramic substrate which provides multiple operating voltage levels at the integrated circuit mounting surface thereof.

It is another object of the invention to provide a multilayer ceramic substrate that does not require a separate input/output pin and power distribution plane for each operating voltage.

These and other objects are provided by a multilayer ceramic substrate which includes voltage supply means for providing a first integrated circuit operating voltage at the top surface, and voltage converting means on the top surface, the input of which is electrically connected to the voltage supply means for providing a second integrated circuit operating voltage at the output thereof. A plurality of voltage converting means may be provided on the top surface, for converting the first operating voltage to a plurality of required operating voltages. The first and all other operating voltages are then routed to appropriate integrated circuit mounting positions on the top surface by means of a system of conductive busses.

More particularly, the first integrated circuit operating voltage is supplied to the top surface by means of a power via which extends to the top surface and is connected to an input/output pin at the bottom surface, either directly or through a power distribution plane within the substrate. The voltage converting means may be a resistor or a solid state voltage divider (e.g., an operational amplifier) which acts to step down the voltage from the power via to a second integrated circuit operating voltage. A plurality of voltage converting means may be provided, the input of each of which is connected to the power via for stepping down the voltage thereat to a plurality of required integrated circuit operating voltages.

The integrated circuit operating voltages at the top surface are routed to appropriate integrated circuit mounting locations at the top surface by providing a primary power buss which electrically connects the power via with the resistors or voltage dividers. The primary power buss also runs to predetermined locations at the top surface for providing the first operating voltage thereat. A plurality of secondary busses, each of which is electrically connected to the output of a step down resistor or a voltage regulator, routes the stepped down voltages to the proper integrated circuit mounting locations.

Thus, according to the present invention, a single substrate pin is required, and only a single operating voltage need be supplied by the motherboard and power supply. Moreover, no internal power distribution planes are required. Multiple voltages are derived at the top surface by appropriate step down resistors or voltage dividers. These resistors or voltage dividers can be fabricated at the top surface by known techniques and do not increase the complexity of the multilayer ceramic structure. The need for a separate input/output pin and power distribution plane for each operating voltage is eliminated.

DETAILED DESCRIPTION OF THE INVENTION

Figure 1:
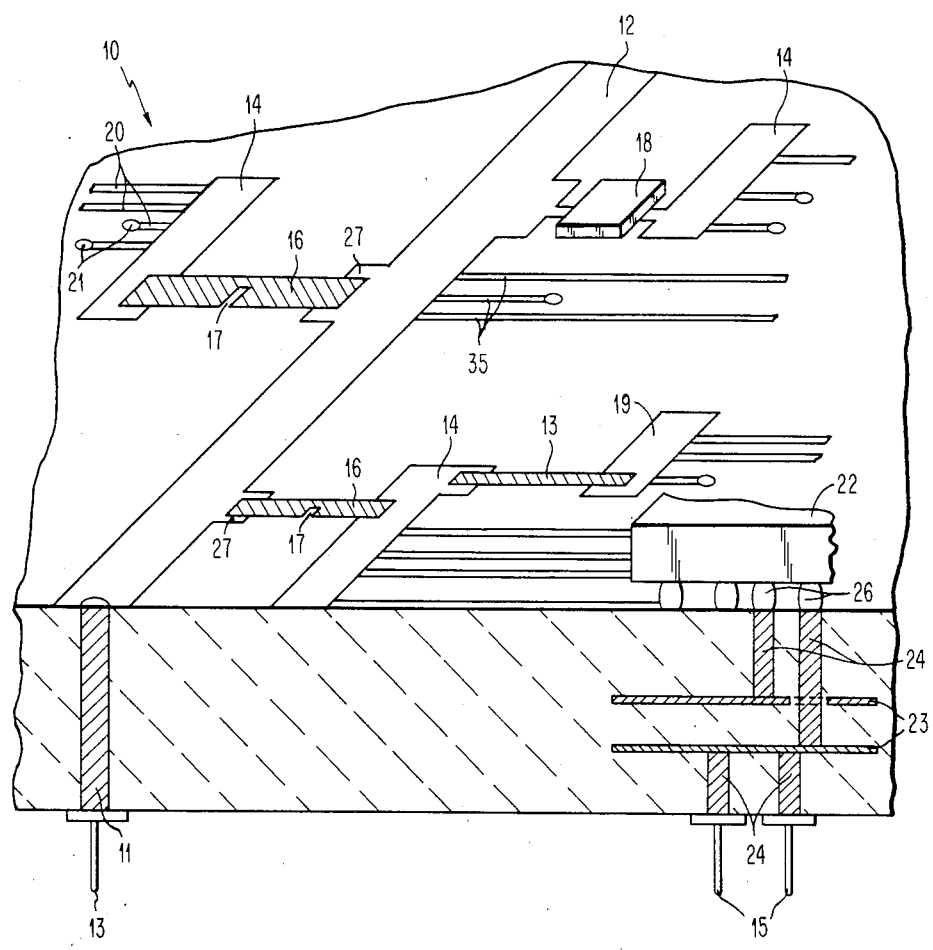
FIG. 1 provides a perspective view in partially broken section showing the arrangement of a first embodiment of the invention.

Referring now to FIG. 1, a multilayer ceramic substrate 10 employing the present invention is illustrated. The detailed construction of a multilayer ceramic substrate and fabrication techniques therefore do not form part of the present invention and are well known in the circuit packaging art. Accordingly, FIG. 1 merely illustrates typical input/output pins 15, signal planes 23, integrated circuit mounting pads 26, interconnecting vias 24, and a mounted integrated circuit chip 22.

According to the invention, a first integrated circuit operating voltage is provided by a power via 11 which extends to the top surface of multilayer ceramic substrate 10. Power via 11 is fabricated in the conventional manner during multilayer ceramic substrate fabrication. Power via 11 is electrically connected to input/output pin 13 either directly as illustrated in FIG. 1 or through a power distribution plane as will be described with regard to FIG. 2. Input/output pin 13 is connected to a suitable integrated circuit operating voltage through a motherboard or card (not shown) or by direct connection to a suitable power supply.

At the top surface, power via 11 is electrically connected to primary buss 12. Primary buss 12 is routed to integrated circuit chip locations which require the first operating voltage as shown at 35. Primary buss 12 and wiring 35 may be fabricated at the same time and in the same manner as other top surface metallization (e.g., engineering change pads) or may be fabricated separately by depositing molybdenum or other conductive material on the top surface according to the requisite routing pattern.

According to the invention, one or more step down resistors 16 or voltage dividers 18 are provided for stepping down the voltage on primary buss 12 to other integrated circuit operating voltages. The resistor or voltage divider output is electrically connected to secondary busses 14 which route the secondary voltages to the requisite integrated circuit mounting pads 21, by means of wiring patterns 20.

Resistors 16 may be formed using well known thin or thick film techniques (e.g., thin film vacuum deposition or plating, or thick film conductive paste screening) and may be trimmed automatically or manually (e.g., using a laser or abrasive media) as shown at 17. Resistors 16 may be formed at the same time that terminating resistors are formed on the top surface. Voltage divider 18 may be an integrated circuit operational amplifier which is mounted on the top surface between the primary buss 12 and the requisite secondary buss 14. Primary buss 12 may also include tabs 27, for providing visual aids for operator inspection of the proper locations of resistor 16 or regulator 18.

Also illustrated in FIG. 1 is the provision for a tertiary buss 19 and step down resistor 13 connecting the tertiary buss to a secondary bus 14, for stepping down the voltage on secondary buss 14. Tertiary buss 13 thus provides an alternate means for stepping down the voltage on primary buss 12. It will be understood by those having skill in the art that any number of step down buss levels may be provided.

Examination of FIG. 1 shows that a plurality of operating voltages may be provided at the top surface using only a single input/output pin and no power distribution plane. Thus, the number of internal wiring layers and the number of input/output pins is reduced. The invention may be employed with any multilayer ceramic substrate design, provided sufficient space is available on the top surface to accommodate the busses and resistors.

Figure 2:
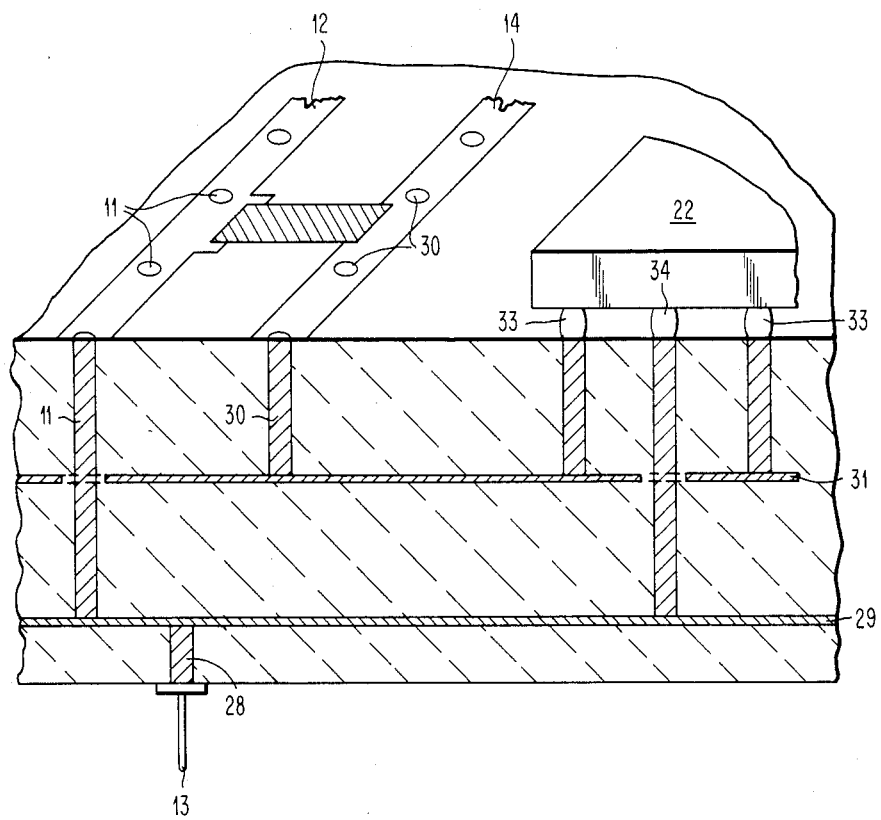
FIG. 2 is a perspective view in partially broken section illustrating a number of variants on the embodiment of FIG. 1.

Referring now to FIG. 2, a number of variants on the embodiment of FIG. 1 are illustrated. In FIG. 2, power via 11 is connected to input/output pin 13 by means of an internal power distribution plane 29 and an auxiliary via 28. Then, the voltage applied to pin 13 may be routed to pads 34 of integrated circuit chip 22 by means of internal power distribution plane 29. It will be noted that when a power distribution plane is employed, a plurality of power vias 11 may be employed to ensure a uniform voltage throughout buss 12.

FIG. 2 also illustrates the use of a secondary power distribution plane 31 for conveying the voltage at secondary buss 14 to chip mounting pad 33. A plurality of vias 30 may be employed to insure uniform voltage on the buss.

It will be recognized by those having skill in the art that either or both of the primary power distribution plane 29 or secondary power distribution plane 31 may be employed in connection with the embodiment of FIG. 1. Accordingly, many combinations of internal power distribution planes and top surface busses may be employed in conjunction with top surface voltage converting means to thereby reduce the number of operating voltages which must be supplied to the substrate.

Whereas we have illustrated and described the preferred embodiment of the invention, it is to be understood that we do not limit ourselves to the precise construction herein disclosed and the right is reserved to all changes and modifications coming within the scope of the invention as defined by the appended claims.

We claim:

1. In a multilayer dielectric material integrated circuit packaging substrate having internal wiring for interconnecting integrated circuit devices mounted at predetermined locations on the top surface thereof, the improvement comprising:

voltage supply means incorporated with said multilayer dielectric material substrate, extending to said top surface of said substrate, providing a first integrated circuit operating voltage at said top surface; and voltage converting means on said top surface, the input of which is electrically connected to said voltage supply means, for providing a plurality of distinct integrated circuit operating voltages at appropriate integrated circuit interconnecting positions at said predetermined locations.

2. The apparatus of claim 1 wherein said voltage supply means is a power via in said multilayer dielectric material substrate, extending to the top surface thereof.

3. The apparatus of claim 2 wherein said power via extends from the bottom surface to the top surface of said multilayer dielectric material substrate.

4. The apparatus of claim 2 further comprising a power distribution plane within said multilayer dielectric material substrate, with said power via extending from said power distribution plane to said top surface.

5. The apparatus of claim 2 further including a primary voltage buss on said top surface, electrically connected between said power via and the input of said voltage converting means.

6. The apparatus of claim 5 wherein said primary voltage buss is routed to predetermined integrated circuit device mounting locations on said top surface.

7. The apparatus of claim 2 further including a secondary voltage buss on said top surface, electrically connected to the output of said voltage converting means, for routing said second integrated circuit operating voltage to predetermined integrated circuit device mounting locations on said top surface.

8. The apparatus of claim 7, further including a tertiary voltage buss on said top surface, and a second voltage converting means on said top surface, the input of which is electrically connected to said secondary voltage buss and the output of which is connected to said tertiary buss.

9. The apparatus of claim 2 further comprising:
   a power distribution plane within said multilayer dielectric material substrate;
   a first via, electrically connecting the output of said voltage converting means and said power distribution plane; and
   a second via electrically connected to said power distribution plane, and extending to said top surface.

10. The apparatus of claim 1 wherein said voltage converting means is a resistive means.

11. The apparatus of claim 1 wherein said voltage converting means is a voltage divider.

12. The apparatus of claim 11 wherein said voltage divider is an operational amplifier voltage divider.

13. The apparatus of claim 1 further including a plurality of voltage converting means on said top surface, the input of each of which is electrically connected to said voltage supply means, for providing a plurality of integrated circuit operating voltages at the outputs thereof.

* * * * *